United States Patent [19]

Washizawa et al.

[11] 4,411,983
[45] Oct. 25, 1983

[54] METHOD FOR PROCESSING AN IMAGE-FORMING MATERIAL

[75] Inventors: Yasuo Washizawa; Fumiaki Shinozaki; Tomoaki Ikeda, all of Asaka; Sho Nakao, Shizuoka, all of Japan

[73] Assignee: Fuji Photo Film Co., Ltd., Kanagawa, Japan

[21] Appl. No.: 357,114

[22] Filed: Mar. 11, 1982

Related U.S. Application Data

[63] Continuation of Ser. No. 228,506, Jan. 26, 1981, abandoned, which is a continuation of Ser. No. 33,071, Apr. 25, 1979, abandoned.

[30] Foreign Application Priority Data

Apr. 25, 1978 [JP] Japan ................................ 53/48837

[51] Int. Cl.³ .............................................. G03C 5/00
[52] U.S. Cl. ................................... 430/325; 430/309; 430/320; 430/330; 430/331
[58] Field of Search ............... 430/294, 309, 331, 320, 430/325, 322, 330

[56] References Cited

U.S. PATENT DOCUMENTS

| 3,475,171 | 10/1969 | Alles | 96/35.1 |
| 3,607,271 | 9/1971 | Hilhorst et al. | 430/331 |
| 3,849,137 | 11/1974 | Barzynski et al. | 204/159.14 |
| 3,891,439 | 6/1975 | Katz et al. | 430/331 |
| 4,130,425 | 12/1978 | Boyd | 430/331 |

OTHER PUBLICATIONS

Sienko et al., *Chemistry,* Second Edition 1961, p. 478 McGraw-Hill.

*Primary Examiner*—Jack P. Brammer
*Attorney, Agent, or Firm*—Sughrue, Mion, Zinn, Macpeak & Seas

[57] ABSTRACT

By treating an imagewise exposed and developed image-forming material comprising a support and a light-sensitive resin composition layer with organic solvents miscible with water or with a mixture of water and organic solvents miscible with water, elimination of non-image areas is completed.

3 Claims, No Drawings

METHOD FOR PROCESSING AN IMAGE-FORMING MATERIAL

CROSS REFERENCE TO RELATED APPLICATIONS

This application is a continuation of Ser. No. 228,506, filed Jan. 26, 1981 now abandoned, which in turn is a continuation of Ser. No. 33,071, filed Apr. 25, 1979, now abandoned.

BACKGROUND OF THE INVENTION

1. Field of the Invention

The present invention relates to a method for processing an image-forming material and, particularly, to a treatment in which a light-sensitive resin composition layer is treated with certain organic solvents miscible with water or with a mixture of certain organic solvents and water to remove completely non-image portions after it has been exposed to light and developed.

2. Description of the Prior Art

There are two types of image-forming material wherein light-sensitive resins are developed with developing solutions. These materials are classified according to the development technique which is used to form the image areas: one is a dissolution type material wherein the non-image areas are completely dissolved in the developing solution, and the other is a falling-off type material wherein materials which have been imagewise exposed are partially dissolved in the developing solutions or are changed in quality such that the image-forming layer can be imagewise removed from the support by rubbing or similar mechanical treatments. Which type of developing method is used depends upon the light-sensitive resins making up the light-sensitive layer, the developers used and further, the combination of the two. Accordingly, based on light-sensitive resins per se an image-forming material cannot absolutely be classified as one type or the other type. However, from the standpoint of a developing solution used, many of the light-sensitive resins which are developable with organic solvents generally belong to the dissolution type, and many of the light-sensitive resins developable with alkaline solutions generally belong to the falling-off type.

In case of development of the falling-off type of material, in order to obtain complete delamination of the light-sensitive layer in the areas to be removed, it is generally necessary to continuously rub the surface of the light-sensitive layer using soft rotary brushes or the like while the material is dipped in a developing solution and/or in a washing bath. Conventional automatic developing machines are usually provided with such rubbing devices and some problems result. For example, the size of automatic developing machines must be made large, large machines are more expensive, and, further, the number of devices in the machine which must be maintained and inspected is increased.

SUMMARY OF THE INVENTION

A principal object of the present invention is to provide a treatment for an imagewise exposed and developed image-forming material capable of completely removing the light-sensitive resin composition from the non-image areas without mechanical treatments such as rubbing, brushing, etc.

A more particular object of the present invention is to provide a treatment for completely removing the light-sensitive resin composition from the non-image areas of an exposed and developed image-forming treatment by using certain organic solvents.

A further object of the present invention is to provide a processing for image-forming materials which, when practiced in the form of an automatic developing apparatus, enables simplification of the apparatus and substantial reductions in size and cost.

The present invention is characterized by a processing method in which, after imagewise exposure and a development processing, an image-forming material comprising a support and a light-sensitive resin layer is treated with certain organic solvents miscible with water or with a mixture of water and certain organic solvents miscible with water.

DETAILED DESCRIPTION OF THE INVENTION

Image-forming materials processable in accordance with the present invention are constructed of a support, a light-sensitive resin layer, an optional thin metallic layer provided between the support and the light-sensitive layer, and a protecting layer provided on the light-sensitive layer.

The support gives the image-forming material the desirable shape (e.g., sheet-like or film-like form), and carries the images formed by development and the subsequent treatment of the present invention. Examples of suitable supports include polymer sheets or films, papers, sheet glass and metallic sheets or films. Specific examples of polymers include cellulose esters such as regenerated cellulose, hard rubber, cellulose diacetate, cellulose triacetate, cellulose acetate propionate, cellulose acetate butyrate, cellulose nitrate, etc.; polyesters such as polyethylene terephthalate, polycarbonates of 2,2-bis(4-hydroxyphenylpropane), etc.; polyamides such as nylon-6 (polycapronamide), nylon-6,6 (polyhexamethyleneadipamide), nylon-6,10 (polyhexamethylenesebacamide), nylon-11 (polyundecanamide), etc.; polymers of vinyl compounds such as polyethylene, polypropylene, polystyrene, poly(methyl acrylate), poly(methyl methacrylate), polyacrylonitrile, poly(vinyl chloride), acrylonitrile-butadiene-styrene copolymer, acrylonitrile-styrene copolymer, vinylidene chloride-vinyl chloride copolymer, polytetrafluoroethylene, polychlorotrifluoroethylene, tetrafluoroethylene-hexafluoropropylene copolymer, etc.; etc. Specific examples of metallic sheets or films include sheets or films of aluminium, zinc, copper, nickel, iron, chromium, titanium, gold, silver, platinum, aluminium-magnesium alloy, aluminium-copper alloy, aluminium-zinc alloy, stainless steel alloys represented by iron-nickel-chromium alloy, phosphorus-bronze alloy, copper-tin alloy, etc. Sodium glass, quartz glass, various kinds of optical glasses and various kinds of ceramics may be used as a material for the support. Films and sheets made up of these materials, thin plates made by laminating films or sheets made up of these materials, thin plates of polymers or glasses into which glass fibers, polymer fibers, natural fibers, asbestos fibers, metallic fibers or carbon fibers are incorporated, textiles on the surface of which the thin layer of polymer is provided, and paper impregnated with polymer can be also used as a support.

The support may be transparent or opaque. In case of opaque supports, essentially opaque materials such as paper and metals, transparent polymer sheets or films which are rendered opaque by admixing dyes or pigments such as titanium oxide, zinc oxide, carbon black and the like and those which have been surface treated as described in Japanese Patent Publication No. 19068/72 (corresponding to British Pat. No. 1,237,475) can be employed as a support.

In addition, the surfaces of the supports may receive certain surface treatments, for example, treatments by corona discharge, ultraviolet radiation, flame, chemical etching, electrolytic etching, graining and the like. Further, on the occasion that an aluminium plate is used as a support, its surface may receive an anodic oxidation treatment alone or may receive sequentially a graining treatment and an anodic oxidation treatment.

The thickness of the support is properly chosen depending upon the purpose of the end-use of the image formed. It may vary, in general, from about 10 μm to 2 mm and preferably it varies from about 15 μm to about 0.5 mm. Of course, depending on the exact use, the support may have a thickness thicker than the thickness within the above-described range, and may be other than a film and a sheet.

Specific examples of light-sensitive resin compositions which make up the light-sensitive resin composition layer of the image-forming materials include (1) combinations of orthoquinone diazides and novolak resins, (2) combinations of azide compounds and natural rubbers, synthetic rubbers or cyclized rubbers, (3) azido substituted light-sensitive resins, (4) light-sensitive resins of the cinnamic acid system, and (5) a wide variety of light-sensitive resin compositions employable as photoetchable resists such as photopolymerizable light-sensitive resins containing ethylenically unsaturated double bonds.

These light-sensitive resin compositions are described in detail below.

Specific examples of orthoquinone diazides used in the compositions belonging to the group (1) include 2,3,4-trioxybenzophenone-bis(naphthoquinone-1,2-diazido-5,5-sulfonic acid ester), 2-(naphthoquinone-1,2-diazido-5-sulfonyloxy)hydroxy-7-naphthalene, naphthoquinone-1,2-diazido-5-sulfanilide, naphthoquinone-1,2-diazido-5-sulfonic acid novolak ester, etc. Such orthoquinone diazides can play an important role as a positive working material because they become alkali-soluble when exposed to light.

Specific examples of the azide compounds used in the compositions belonging to the group (2) include p-phenylenebisazide, p-azidobenzophenone, 4,4'-diazidobenzophenone, 4,4'-diazidophenylmethane, 4,4'-diazidostilbene, 4,4'-diazidochalcone, 2,6-di(4'-diazidobenzal)cyclohexanone, 2,6-di(4'-azidobenzal)-4-methylcyclohexanone, etc.

Specific examples of the light-sensitive resins used in the compositions belonging to the group (3) include polyvinyl azidobenzoate, polyvinyl azidophthalate, polyazidostyrene, polyvinyl azidobenzalacetal, polyvinyl azidonaphthylacetal, phenol-azidobenzaldehyde resin, azidodiphenylamineformaline condensation polymer, the azido high polymer of polyvinyl alcohol, the azido high polymer of cellulose such as azidophthalate of partially hydrolyzed cellulose, the azido polymer of gelatin or casein, etc.

Specific examples of light-sensitive resins of cinnamic acid system, which belong to the group (4), include vinyl polymers such as polyvinyl cinnamate, poly(vinyl m-nitrocinnamate), polyvinyl α-cyanocinnamate, polyvinyl α-nitrocinnamate, polyvinyl β-nitrocinnamate, polyvinyl α-chlorocinnamate, polyvinyl β-chlorocinnamate, polyvinyl cinnamylideneacetate, polyvinyloxyethylcinnamate, polyvinyl thioethylcinnamate, poly(2-cinnamoyloxyethylacrylate), poly(2-cinnamoyloxyethylmethacrylate), polyvinyl cinnamoyloxyacetate, poly(p-cinnamoyloxyvinylbenzene), poly(p-cinnamoylstyrene), etc., and copolymers of these vinyl polymers and other polymers; polymers obtained by ring-opening polymerization of oxiranes such as polyglycidyl cinnamate, polyglycidyl cinnamylideneacetate and the like; polymers into which light-sensitive groups are introduced entirely or partially by reacting polymers having halogenated alkyl groups in the side chains with carboxylates having light-sensitive groups in aprotic polar solvents, such as polymers obtained by reacting polychloroethylvinyl ether, polyvinyl chloroacetate, poly(β-chloroethylacrylic acid ester), polyepichlorohydrin, polyepibromohydrin and the like with cinnamic acid; cationic polymers of vinyl ethers such as polyvinyl oxyethylcinnamate, etc.; etc. Of the light-sensitive resins of the cinnamic acid system, the most preferable resins are mixtures of unsaturated light-sensitive polyester compounds as disclosed in U.S. Pat. No. 3,030,208, and in particular light-sensitive resins of the following general formula:

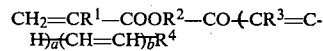

wherein $R^1$ is a hydrogen atom, a halogen atom, a nitrile group or a lower alkyl group; $R^2$ is a divalent aliphatic group; $R^3$ is a hydrogen atom or a nitrile group; $R^4$ is an aromatic nucleus; and a and b each is 0 or 1, where the sum total of a and b is 1 or 2. Suitable examples of divalent aliphatic groups for substituent $R^2$ are —CH₂—(methylene group);

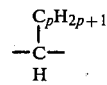

(alkylidene group; p=1–10, preferably 1–5; e.g., ethylidene, propylidene, butylidene, pentylidene, hexylidene, etc.);

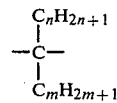

(1-alkylalkylidene group; m+n=2–10, preferably 2–5; e.g., isopropylidene, 1-methylethylidene, 1-methylpropylidene, 1-ethylethylidene, 1-ethylpropylidene, etc.); and the like.

The photopolymerizable light-sensitive resin compositions containing compounds having ethylenically unsaturated bonds belonging to the group (5) comprise monomer and binder components which are described in detail in U.S. Pat. Nos. 2,760,863; 3,060,026, etc. Specific examples of the monomers include acrylic or methacrylic acid esters of polyhydric alcohols, with preferred examples including ethylene glycol, triethylene glycol, tetraethylene glycol, propylene glycol, trimethylol propane, pentaerythritol, neopentyl glycol, etc. In addition, denatured acrylic acid esters derived from bisphenol A, such as reaction products of epoxy resin prepolymers of a bisphenol A-epichlorohydrin reaction product and acrylic or methacrylic acid;

acrylic or methacrylic acid esters of alkylene oxide adducts of bisphenol A or the hydrogenation products thereof; etc., can also be employed. Besides these, methylenebisacrylamide, ethylenebisacrylamide and bisacrylamides or bismethacrylamides of diamines such as ethylenediamine, propylenediamine, butylenediamine, pentamethylenediamine, etc.; reaction products of diolmonoacrylates or diolmonomethacrylates with isocyanates; and triacryl formal or triallyl cyanurate can be also employed as monomer. The monomer content may vary from about 10% by weight to about 99% by weight, preferably 20% by weight to 50% by weight, to the total weight of photopolymerizing light-sensitive resin composition, which contains binder polymers and photopolymerization initiators described hereinafter in addition to the monomer.

As the binder, various polymers as reported in the above-described U.S. patents can be used.

The developing solution used to develop light-sensitive resin composition layers depends largely upon the solubility of the binder polymers contained in the layer in the developing solution. From the standpoint of environmental hygiene, preferable developing solutions are those which do not contain a large amount of organic solvents. Therefore, favorable binder polymers are those which have carboxyl, hydroxyl or like groups and thereby can be dissolved in or swelled with an alkaline aqueous solution. As examples of such binder polymers, mention may be made of vinyl addition polymers containing free carboxylic acid groups, which are prepared from 30 to 94 mol % of one or more alkyl acrylates and the residual mole % of one or more $\alpha,\beta$-ethylenically unsaturated carboxylic acids and more preferably, from 61 to 94 mol % of two alkylacrylates and the residual mol % $\alpha,\beta$-ethylenically unsaturated carboxylic acid(s). Specific examples of alkylacrylates suitable for preparation of the above-described polymer binders include methyl acrylate, ethyl acrylate, propyl acrylate, butyl acrylate, methyl methacrylate, ethyl methacrylate, butyl methacrylate, etc. Suitable $\alpha,\beta$-ethylenically unsaturated carboxylic acids are acrylic acid, methacrylic acid, etc. The above-described binders and the preparation thereof are described in German Patent Application (OLS) No. 2,320,849.

As another example of such binder polymers, mention may be made of macromolecular binder polymers preformed by copolymerizing styrene type vinyl monomers with carboxyl group-containing unsaturated monomers, which are compatible with the monomers hereinbefore described, as described in detail in British Pat. No. 1,361,298. As a further example of such binder polymers, mention may be made of the mixtures of two polymers as described in Japanese Patent Application (OPI) No. 99810/77 (corresponding to U.S. Pat. No. 4,139,391) (The term "OPI" as used herein refers to a "published unexamined Japanese patent application") and Belgian Pat. No. 828,237. The first polymer is preferably selected from a group consisting of copolymers of vinyl acetate and crotonic acid, terpolymers of ethyl acrylate, methyl methacrylate and acrylic acid, and cellulose acetate succinate. The second polymer is preferably selected from a group consisting of toluenesulfonamideformaldehyde condensation polymers, methyl methacrylate-methacrylic acid copolymer, benzyl methacrylate-methacrylic acid copolymer, methyl methacrylate-ethyl acrylate-hydrogen maleate terpolymer, vinyl chloride-vinyl acetate-maleic acid terpolymer, styrene-maleic anhydride copolymer, and methyl methacrylate-ethyl acrylate-methacrylic acid terpolymer.

A photopolymerization initiator is additionally contained in the photopolymerizable light-sensitive resin composition. As the photopolymerization initiators, compounds as described in Jaromir Kosar, *Light-Sensitive Systems*, Chapter 5, John Wiley and Sons, Inc., New York (1965), U.S. Pat. Nos. 2,760,863; 3,060,023 and 3,418,118, Japanese Patent Publication No. 20067/69 (corresponding to British Pat. No. 1,090,142 and to U.S. Pat. No. 3,427,161), etc., can be employed.

The light-sensitive resin composition can be colored by adding known dyes and pigments thereto.

Of the above-described light-sensitive resin compositions, the most preferable compositions processable by the method of the present invention are photopolymerizable light-sensitive resin compositions (hereinafter called photopolymerizable compositions).

The thickness of the light-sensitive resin composition layer may vary from about 0.1 $\mu$m to about 1 mm, preferably from about 0.2 $\mu$m to about 50 $\mu$m and more preferably from about 0.5 $\mu$m to about 10 $\mu$m.

Further, a protecting layer may be provided on the light-sensitive resin composition layer, which is made up of an organic compound as described in Japanese Patent Application (OPI) No. 109926/77 (corresponding to U.S. patent application Ser. No. 772,044, filed Feb. 25, 1977), Japanese Patent Publication No. 32714/71 (corresponding to U.S. Pat. No. 3,475,171), and so on, with specific examples including higher fatty acids, higher fatty acid amides, solid hydrocarbons containing 25 or more of carbon atoms, polyvinyl alcohol, polyvinyl acetate hydrolyzed in a proportion of 88 to 99%, ethylene oxide polymers, gelatin, gum arabic, rosin and so on, and has a thickness within the range of about 0.1 $\mu$m to about 3 $\mu$m and preferably about 0.2 $\mu$m to about 2 $\mu$m may optionally be provided. The protecting layer may be developing solution permeable in which case it need not be removed prior to processing.

Some of image-forming materials processable using the method of the present invention may have a thin metallic layer between the support and the light-sensitive resin composition layer. Such a metallic layer is made up of metals etchable with conventional alkaline etching solutions. Specific examples of such metals include metal compositions containing aluminium as a main component, as described in detail in Japanese Patent Application (OPI) No. 139720/75; and tellurium, molybdenum, polonium, cobalt, zinc, copper, nickel, iron, tin, vanadium, germanium and the alloys thereof, as described in each of Japanese Patent Application (OPI) Nos. 65927/73 (corresponding to U.S. patent application Ser. No. 205,860, filed Dec. 8, 1971 and to DT-OS No. 2,259,768), 65928/73 (corresponding to U.S. patent application Ser. No. 205,861, filed Dec. 8, 1971 and to DT-OS No. 2,259,759) and 2925/75 (corresponding to U.S. patent application Ser. No. 350,372, filed Apr. 12, 1973 and to DT-OS No. 2,413,154), and Japanese Patent Publication No. 14161/75. The thickness of such a metallic layer is determined depending upon the optical density required for the image, and the optical density of the image obtained is approximately proportional to the thickness of the metallic layer. For instance, in case the line images or halftone dot images, relatively high densities are required and the optional density should be at least 2.0 or more. In particular, when such images are used as a mask for printing onto a PS printing plate, optical densities of at least 3.0 are required. Therefore, the thickness of the metallic layer is fixed so as to provide the density desired. For example, in case that a layer prepared by evaporating in vacuo an aluminum-iron alloy onto a support is used as a metallic layer, about a 40 nm thickness is required to attain an optical density of 2.0, while about a 60 nm thickness is required for attainment of the optical density of 3.0. The relation between the thickness of such a metallic layer and the optical density of image obtained varies somewhat with condition of the metallic layer formation, for example, vacuum evaporation, but roughly speaking, almost the same relations hold. Although it is not prohibited to set the thickness of the metallic layer thicker than it is necessary to obtain the desired optical density, such is undesirable because the materials for the metallic layer are wasted and the etching treatment for image formation takes too long time. In addition, too long an etching time causes deterioration in the properties of the light-sensitive resin composition in some circumstances. Taking into account the above-described disadvantages, thicknesses larger than is necessary should be avoided.

The image-forming materials having the constructions described hitherto can be prepared in accordance with methods reported in U.S. Pat. No. 4,008,084 and Japanese Patent Application (OPI) No. 99814/77 (corresponding to U.S. patent application Ser. No. 768,671, filed Feb. 14, 1977 which continued to U.S. patent application Ser. No. 921,540, filed July 3, 1978), etc.

Now, imagewise exposure and development processing of the image-forming materials having the constructions described above are described in detail. An original image to be copied (e.g., an image bearing transparency) is closely superposed upon the light-sensitive resin composition layer or the protecting layer, and the layer is irradiated with actinic radiation through the original. On the other hand, original images may be reduced, equalized or enlarged in size by placing an optical lens system between the original and the image-forming material, and through the resulting image the image-forming material may be exposed to actinic radiation. Imagewise exposure can be carried out in such a manner that the intensity of the radiation (the intensity of illumination) is adjusted so that the exposure may be concluded within a period of about 0.5 second to about 3 minutes, preferably about 1 second to about 2 minutes, and more preferably about 2 seconds to about 1 minute. In general, imagewise exposure is carried out at a room temperature (corresponding to the temperature within the range of about 10° C. to about 40° C.), however, it may be optionally carried out at a temperature of about 40° C. to about 80° C. In case of an image-forming material having a photopolymerizable composition layer as the uppermost layer, imagewise exposure should be carried out substantially in the absence of oxygen, i.e., under reduced pressure or in the presence of inert gas such as nitrogen, carbon dioxide or the like.

A light source which emits light comprising active radiation at wavelengths within the range of about 280 nm to about 500 nm, with specific examples including a high pressure mercury vapor lamp, a xenon discharge lamp, a carbon arc lamp, a fluorescent discharge lamp for copying, laser beams and the like, can be employed for the imagewise exposure. Besides the above-described lamps, electron beams and X-rays also can be employed as the radiation source. On the occasion that CRT, laser beam or electron beam is used, all portions of the original image may be exposed to light at the same time, or the original image may be exposed to light by scanning.

After imagewise exposure, the image-forming materials are developed with a developing solution. Preferable developing solutions are alkaline aqueous solutions. As alkaline substances, NaOH, KOH, $Na_3PO_4$, $Na_2CO_3$ and the like can be employed. Specific examples of developing solutions of the kind which are composed of alkaline aqueous solutions include those which are described in Japanese Patent Publication Nos. 23045/69, 32714/71 (corresponding to U.S. Pat. No. 3,475,171) and 20964/72 (corresponding to U.S. Pat. No. 3,647,443 and to British Pat. No. 1,320,340), Japanese Patent Application (OPI) Nos. 34323/74, 62427/77 (corresponding to U.S. patent application Ser. No. 632,726, filed Nov. 17, 1975 and to DT-OS No. 2,651,864) and 99101/77 (corresponding to U.S. Pat. No. 4,098,712), etc. Methods of applying the developing solutions to the light-sensitive resin composition layers of image-forming materials are also reported in each of the above-described patent specifications. For instance, the image-forming materials may be dipped in the developing solution, coated with the developing solution using rollers, brushes or like means, or sprayed with the developing solution.

The thus development-processed image-forming material may optionally be washed with water.

The resulting image-forming material is, then, treated with an organic solvent(s) miscible with water, or with a mixture of water and an organic solvent(s) miscible with water. A wide variety of organic solvents are described in *Pocket Book of Solvents,* compiled by the Japan Society for Organic Synthetic Chemistry and published by Ohmu Co., (1967) and may be employed as organic solvents miscible with water. As examples of such solvents, mention may be made of alcohols, alkylene glycol alkyl ethers and alkylene glycol aryl ethers. Suitable examples of such alcohols are aliphatic alcohols having 1 to 5 carbon atoms, e.g., methanol, ethanol, propanol, butanol, isopropyl alcohol, isoamyl alcohol, etc., and aromatic alcohols having 7 to 8 carbon atoms, e.g., benzyl alcohol, $\beta$-phenylethyl alcohol, etc. Suitable examples of alkylene glycol alkyl ethers are those having 3 to 9 carbon atoms in which the alkylene glycol moiety thereof has 2 to 6 carbon atoms, the repeating glycol unit thereof ranges from 1 to 3 and the alkyl moiety thereof has 1 to 5 carbon atoms, such as ethylene glycol monomethyl ether, ethylene glycol monoethyl ether, ethylene glycol monoisopropyl ether, ethylene glycol monobutyl ether, diethylene glycol monomethyl ether, diethylene glycol monoethyl ehter, diethylene glycol monobutyl ether, ethylene glycol isoamyl ether, triethylene glycol monomethyl ether, triethylene glycol monoethyl ether, propylene glycol monomethyl ether, propylene glycol monoethyl ether, propylene glycol monobutyl ether, dipropylene glycol monoethyl ether, etc. Specific examples of alkylene glycol aryl ethers are those in which the aryl moiety thereof has 6 to 7 carbon atoms, such as ethylene glycol monophenyl ether, ethylene glycol mono-p-tolyl ether, etc. In addition, the above-described organic solvents can also be employed in combination. More favorable organic solvents among the above-described solvents are benzyl alcohol, alkylene glycol monoalkyl ethers (preferably, ethylene glycol monomethyl ether, ethylene glycol monoethyl ether, ethylene glycol monoisopropyl ether and ethylene glycol monobutyl ether), ethylene glycol monophenyl ether and the combinations thereof. Also, mixtures of water and organic solvents miscible with water are preferably used. In this case, the organic solvents preferably used are the same as described above as more favorable organic solvents. A mixing ratio by volume of water to the organic solvent miscible with water ranges from about 100:0.2 to 100:10 and preferably from about 100:0.5 to 100:7.

As methods for applying the organic solvents miscible with water or mixtures of water and the organic solvents miscible with water to the development-processed image-forming materials, there are various methods similar to those described in the application of developing solutions thereto. Specifically, the application of the organic solvent miscible with water or the mixture can be applied to the image-forming material by, for instance, dipping the image-forming material in the above-described organic solvent or mixture, coating the above-described organic solvent or mixture on the development-processed light-sensitive resin composition layer using a roller or a brush, or spraying the above-described organic solvent or mixture onto the development-processed light-sensitive resin composition layer. The above-described treatments are carried out at a temperature of about 10° C. to about 60° C. and preferably about 15° C. to about 50° C. The organic solvent or, in case of the mixture the mixing ratio, and processing temperature are selected such that the time required for treatment is about 0.5 second to about 2 minutes and preferably about 1 second to 1 minute to dissolve and eliminate completely the non-image portions of the light-sensitive resin composition layer to be removed therefrom.

After the image-forming material is treated with the organic solvent(s) miscible with water or with the mixture of water and the organic solvent(s) miscible with water in the above-described manner, it is optionally washed with water and dried.

A principal advantage in treating the image-forming material development-processed with a conventional developing solution in accordance with the method of the present invention is that a rubbing treatment using brushes or sponge to completely eliminate the non-image portion of a light-sensitive resin composition layer, which has been conventionally carried out in the process of development or washing, becomes unnecessary. Accordingly, on the occasion that the method of the present invention is materialized in a developing apparatus, the developing apparatus does not need the rubbing-off means installed with brushes or sponge, and it may be furnished with only devices in which individual treatments are carried out using fitted liquids alone. Therefore, the construction of the developing apparatus itself can be simplified and consequently any problems are reduced and the price of a developing apparatus can be significantly lowered.

The present invention will now be illustrated in greater detail by reference to the following examples.

EXAMPLE 1 AND COMPARISON EXAMPLE 1

About 400 mg of Al-Fe alloy (1:1 by atomic ratio) was placed in an evaporating boat arranged inside a vacuum evaporating apparatus, and the Al-Fe alloy was vacuum deposited in a thin layer about 100 nm thick onto a polyethylene terephthalate film having a thickness of 100 μm, which was arranged about 30 cm away from the evaporating boat. The pressure in the vacuum evaporating apparatus was about $5 \times 10^{-4}$ Torr. On the thus-obtained metal evaporated film, a light-sensitive composition composed of the following weights of ingredients was coated using a rotary coating machine so that the thickness thereof is about 3 μm in a dry state, and dried at a temperature of 100° C. for a period of 2 minutes.

| Composition of Light-Sensitive Composition Layer: | |
|---|---|
| Benzyl Methacrylate-Methacrylic Acid Copolymer (mole ratio = 73:27, $[\eta]_{25°C}^{MEK*} = 0.1$) | 1 g |
| Pentaerythritol Tetraacrylate | 0.8 g |
| N—Methyl-2-benzoylmethylene-β-naphthothiazole | 0.05 g |
| Behenic Acid | 0.02 g |
| Methyl Ethyl Ketone | 7 g |
| Methyl Cellosolve Acetate | 7 g |

*Methyl ethyl ketone

Next, on the resulting light-sensitive layer, a protection layer composition containing the following ingredients by weight was coated at a dry coverage of 3 μm using a rotary coating machine and then, dried at 100° C. for 3 minutes.

| Composition of Protection Layer: | |
|---|---|
| Polyvinyl Alcohol (saponification degree: 86.5 to 89.0 mol %) | 4 g |
| Methanol | 16 g |
| Water | 80 g |
| Colloidal Silica (grain diameter: about 0.3 μm) | 0.1 g |
| Cationic (carboxylic acid type) Surface Active Agent "Anon LG" (trade name of Nippon Oils & Fats Co., Ltd.) | 0.5 g |
| Cationic (carboxylic acid type) Surface Active Agent "Anon BF" (trade name of Nippon Oils & Fats Co., Ltd.) | 0.5 g |

The thus-obtained light-sensitive material was arranged one meter from a PS Light (a 2 kw metal halide lamp manufactured by the Fuji Photo Film Co., Ltd.) and imagewise exposed for 30 seconds. Then, the resulting light-sensitive material was subjected to developing and a washing treatments by being passed in sequence through four tanks of a "RAPIDOPRINT-DD 1437" developing apparatus manufactured by Agfa-Gevaert Co. The first and second tanks contained a developing solution having the following composition at 35° to 70° C., while the third and the fourth tanks contained city water containing benzyl alcohol in a concentration of 2% by volume. Time required for passing through each of the tanks was 7 seconds.

| Composition of Developing Solution: | |
|---|---|
| Sodium Hydroxide | 15 g |
| Sodium Bromate (NaBrO₃) | 10 g |
| Sodium Phosphate (Na₃PO₄.12H₂O) | 0.5 g |
| Water | 1 l |

The unexposed portions of the processed light-sensitive layer of the light-sensitive material was completely eliminated.

Separately, the light-sensitive material was processed in the same manner as described above except that only city water to which benzyl alcohol was not added in any amount was used as a washing solution. In this case, the unexposed portions of the light-sensitive layer could not be completely eliminated and a good deal of residue was observed.

EXAMPLES 2 TO 5

The same light-sensitive material as prepared in Example 1 received the same treatments as in Example 1 except that instead of placing benzyl alcohol-containing city water in the third tank a 4% by volume ethylene glycol monobutyl ether aqueous solution, a 1% by volume ethylene glycol monophenyl ether aqueous solution, a 4% by volume diethylene glycol monomethyl ether aqueous solution, and an aqueous solution containing both benzyl alcohol in a concentration of 0.5% by volume and ethylene glycol monophenyl ether in a concentration of 0.5% by volume were used, respectively, in Examples 2 to 5. As in Example 1, in each of Examples 2 to 5, a desirable result was obtained.

EXAMPLE 6

The same light-sensitive material prepared in Example 1 received the same treatments as in Example 1 to the developing stage (corresponding to developing treatments undertaken in the first and the second tanks). Then, the developed light-sensitive material was removed from the developing apparatus and dipped in benzyl alcohol in a vat for 7 seconds and further dipped in water in a vat for 7 seconds. Upon removal from the vat, clearly eliminated areas were observed at the unexposed portions of the light-sensitive layer.

EXAMPLE 7

A light-sensitive composition containing the following ingredients was coated on polyethylene terephthalate film having a thickness of 100 μm at a dry coverage of 3 μm using a rotary coating machine, and dried at a temperature of 100° C. for 2 minutes.

| Composition of Light-Sensitive Composition Layer: | |
| --- | --- |
| Benzyl Methacrylate-Methacrylic Acid Copolymer (as used in Example 1) | 1 g |
| Pentaerythritol Tetraacrylate | 0.72 g |
| 4,4'-Bis(dimethylamino)benzophenone | 30 mg |
| 2-o-Chlorophenyl-4,5-diphenylimidazolyl Dimer | 60 mg |
| Black Pigment "Microlith 4G Black" (Bayer A.G., West Germany) | 500 mg |
| Methyl Ethyl Ketone | 10 g |

| -continued | |
| --- | --- |
| Composition of Light-Sensitive Composition Layer: | |
| Methyl Cellosolve Acetate | 10 g |

Next, the same polyvinyl alcohol composition as in Example 1 was similarly coated on the light-sensitive layer and dried in the same manner as in Example 1. The thus-obtained light-sensitive material was subjected to, in sequence, imagewise exposure, development and washing treatments in the same manner as in Example 1. Thus, the unexposed portions of the light-sensitive layer were completely eliminated and a desirable result was obtained.

The same light-sensitive material was treated in the same manner as in Comparison Example 1, and the result obtained was compared with that of Example 7. A good deal of the unexposed areas remained as a residue and there was a remarkable difference between this comparison and Example 7.

While the invention has been described in detail and with reference to specific embodiments thereof, it will be apparent to one skilled in the art that various changes and modifications can be made therein without departing from the spirit and scope thereof.

What is claimed is:

1. In a method of processing an image-forming material comprising a support having thereon an alkaline solution developable light-sensitive resin composition layer developable by fall-off development including image-wise exposure followed by contact with an alkaline developer solution and mechanical abrasion, the improvement which comprises said method comprising the sequential steps of
   (1) imagewise exposing said image-forming material,
   (2) contacting said image-wise exposed image-forming material obtained in (1) with said alkaline developer solution, and
   (3) subsequently treating the developer solution-contacted image-forming material obtained in (2) with a mixture of water and an organic solvent miscible with water in a volume ratio of water to organic solvent of 100:0.2 to 100:10, said organic solvent being selected from the group consisting of ethylene glycol monophenyl ether, benzyl alcohol, ethylene glycol monobutyl ether, ethylene glycol monoethyl ether, ethylene glycol monomethyl ether and diethylene glycol monomethyl ether.

2. The method of claim 1, wherein said treatment with said organic solvent is carried out at 10° to 60° C.

3. The method of claim 1, wherein said light-sensitive resin is a photopolymerizable light-sensitive resin.

* * * * *